(12) United States Patent
Shi et al.

(10) Patent No.: US 12,522,940 B2
(45) Date of Patent: Jan. 13, 2026

(54) METHOD OF MANUFACTURING QUANTUM-DOT THIN FILM, QUANTUM-DOT SUBSTRATE, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Zhiqing Shi, Guangdong (CN); Jinyang Zhao, Guangdong (CN); Lixuan Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 760 days.

(21) Appl. No.: 17/816,410

(22) Filed: Jul. 30, 2022

(65) Prior Publication Data

US 2023/0407512 A1    Dec. 21, 2023

(30) Foreign Application Priority Data

Jun. 21, 2022   (CN) .......................... 202210709397.6

(51) Int. Cl.
  *C25D 13/12*   (2006.01)
  *B82Y 20/00*   (2011.01)
  (Continued)

(52) U.S. Cl.
  CPC ............ *C25D 13/12* (2013.01); *C09K 11/025* (2013.01); *C25D 13/04* (2013.01); *B82Y 20/00* (2013.01); *B82Y 40/00* (2013.01); *H10K 59/38* (2023.02)

(58) Field of Classification Search
  CPC ........ C25D 13/12; C25D 13/04; C25D 13/02; C25D 13/22; C09K 11/025; C09K 11/02;
  (Continued)

(56) References Cited

U.S. PATENT DOCUMENTS 9,236,572 B2 *   1/2016   Tilyou ................. H10K 50/115

FOREIGN PATENT DOCUMENTS

CN        107522723 A       12/2017
CN        111117598 A  *    5/2020  ........... C09K 11/665
(Continued)

OTHER PUBLICATIONS

"Electrophoretic Deposition of Quantum Dots and Characterisation of Composites" by Milton et al., Materials 12, 4089 (2019).*
(Continued)

*Primary Examiner* — Bryan D. Ripa
(74) *Attorney, Agent, or Firm* — PV IP PC; Christopher S. Ruprecht; Wei Te Chung

(57) ABSTRACT

A method of manufacturing a quantum-dot thin film, a quantum-dot substrate, and a display panel are provided. The method includes following steps: providing a quantum-dot solution, wherein the quantum-dot solution includes a quantum-dot mixture and a solvent, the quantum-dot mixture includes a plurality of quantum dots and a plurality of quantum-dot ligands, and the quantum-dot ligands include a long-chain ligand and a short-chain ligand; providing an electrode substrate, and dripping the quantum-dot solution onto the electrode substrate; and depositing the quantum-dot mixture of the quantum-dot solution on the electrode substrate by an electrophoresis deposition method to form the quantum-dot thin film on the electrode substrate. The quantum-dot ligands having different lengths of molecular chains are used to modify the quantum dots to reduce adhesion between particles. The quantum-dot thin film manufactured
(Continued)

by electrophoresis deposition has great shape uniformity and good surface uniformity.

8 Claims, 3 Drawing Sheets

(51) Int. Cl.
*B82Y 40/00* (2011.01)
*C09K 11/02* (2006.01)
*C25D 13/04* (2006.01)
*H10K 59/38* (2023.01)

(58) Field of Classification Search
CPC ........ B82Y 20/00; B82Y 40/00; H10K 59/38; H10K 50/115; H10K 2102/331; H10K 71/12; G02F 1/133614
See application file for complete search history.

(56) References Cited

FOREIGN PATENT DOCUMENTS

| | | | |
|---|---|---|---|
| CN | 113089054 A | 7/2021 | |
| CN | 113698925 A | 11/2021 | |
| CN | 113809273 A | * 12/2021 | ............. C25D 13/12 |

OTHER PUBLICATIONS

Machine Translation of CN-111117598-A.*
Chinese Office Action issued in corresponding Chinese Patent Application No. 202210709397.6 dated Sep. 11, 2023, pp. 1-8.

* cited by examiner

Providing a quantum-dot solution, wherein the quantum-dot solution comprises a quantum-dot mixture and a solvent, the quantum-dot mixture comprises a plurality of quantum dots and a plurality of quantum-dot ligands, and the quantum-dot ligands include a long-chain ligand and a short-chain ligand. — S1

Providing an electrode substrate, and dripping the quantum-dot solution onto the electrode substrate. — S2

Depositing the quantum-dot mixture of the quantum-dot solution on the electrode substrate by an electrophoresis deposition method to form the quantum-dot thin film on the electrode substrate. — S3

FIG. 1

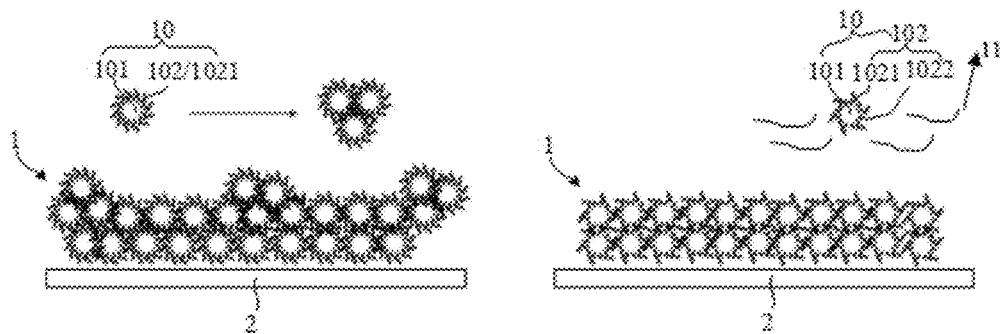

FIG. 2

Deposition order R to G     Individual deposition R
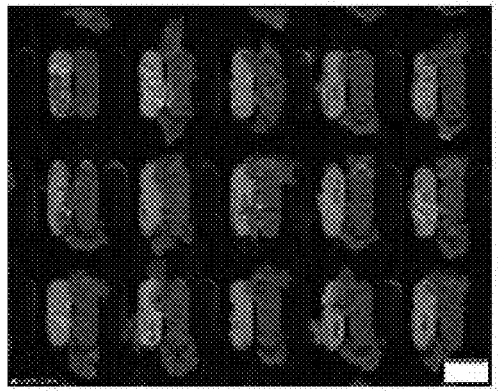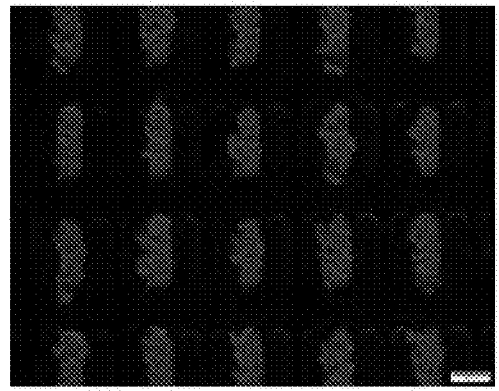
FIG. 4A
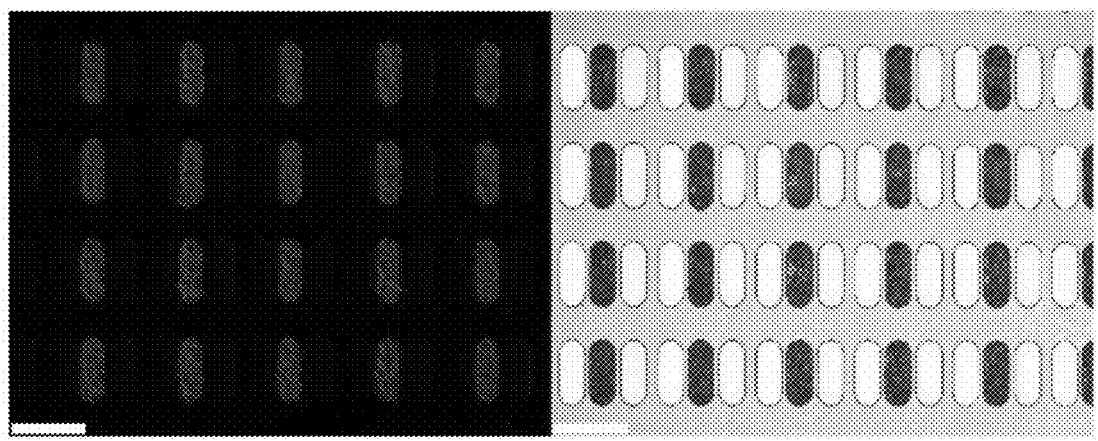
FIG. 4B

METHOD OF MANUFACTURING QUANTUM-DOT THIN FILM, QUANTUM-DOT SUBSTRATE, AND DISPLAY PANEL

FIELD

The present disclosure relates to a field of display technologies, and more particularly, to a method of manufacturing a quantum-dot thin film, a quantum-dot substrate, and a display panel.

BACKGROUND

Nowadays, methods of processing quantum-dot color filters mainly include a photo etching method and an inkjet printing method. The photo etching method has problems of low luminescent efficiency and poor stability, and the inkjet printing method has problems of poor repeatability and a long process time. An electrophoresis deposition method uses two principles to manufacture quantum-dot thin films. One is that quantum-dot materials with charges will move along a certain direction under an electric field, and the other is that quantum-dot materials will be selectively deposited on a certain electrode. The electrophoresis deposition method is convenient and fast, and can achieve quantum-dot thin films with a great area.

In process of manufacturing quantum-dot thin films by the electrophoresis deposition method, a size of a ligand will directly affect a movement state and an accumulation state of quantum dots under an electric field. When a molecular chain of a ligand is relatively long, quantum dots are easy to be accumulated under an electric field, which is beneficial for forming a patterned thin film. As such, a formed quantum-dot thin film has great shape uniformity, but has poor shape uniformity. In contrast, when a molecular chain of a ligand is relatively short, quantum dots are difficult to be accumulated on a patterned electrode under affection of liquid because the relatively short molecular chain of the ligand results in relatively weak accumulation strength of the quantum dots. Therefore, a formed quantum-dot thin film has great surface uniformity, but has poor shape uniformity. In summary, a quantum-dot thin film with both great shape uniformity and good surface uniformity is difficult to be manufactured.

SUMMARY

Embodiments of the present disclosure provide a method of manufacturing a quantum-dot thin film, a quantum-dot substrate, and a display panel to solve a following technical issue: quantum-dot thin films having both great shape uniformity and good surface uniformity are difficult to be manufactured by an electrophoresis deposition method because a molecular chain of a quantum-dot ligand is relatively long or relatively short.

To solve the above issue, technical solutions provided by the present disclosure are described as follows.

The present disclosure provides a method of manufacturing a quantum-dot thin film, comprising following steps:
providing a quantum-dot solution, wherein the quantum-dot solution comprises a quantum-dot mixture and a solvent, the quantum-dot mixture comprises a plurality of quantum dots and a plurality of quantum-dot ligands, and the quantum-dot ligands comprise a long-chain ligand and a short-chain ligand;
providing an electrode substrate, and dripping the quantum-dot solution onto the electrode substrate; and
depositing the quantum-dot mixture of the quantum-dot solution on the electrode substrate by an electrophoresis deposition method to form the quantum-dot thin film on the electrode substrate.

According to the method of manufacturing the quantum-dot thin film provided by the present disclosure, a ratio of an amount of the short-chain ligand to a total amount of the quantum-dot ligands ranges from 30% to 60%.

According to the method of manufacturing the quantum-dot thin film provided by the present disclosure, an amount of the quantum dots in the quantum-dot solution ranges from 0.1 wt % to 50 wt %, an amount of the quantum-dot ligands in the quantum-dot solution ranges from 0.01 wt % to 50 wt %, and the quantum-dot solution comprises the 1 wt % to 90 wt % solvent.

According to the method of manufacturing the quantum-dot thin film provided by the present disclosure, the quantum-dot ligands comprise a polyalcohol derivative and a polyester derivative having different molecular weights, a molecular weight of the polyalcohol derivative and a molecular weight of the polyester derivative range from 50 to 5000.

According to the method of manufacturing the quantum-dot thin film provided by the present disclosure, a molecular weight of the long-chain ligand ranges from 800 to 5000, and a molecular weight of the short-chain ligand ranges from 50 to 700.

According to the method of manufacturing the quantum-dot thin film provided by the present disclosure, the polyalcohol derivative comprises a poly(ethylene adipate) derivative, a polyethylene glycolate derivative, and a thiol derivative, and the polyester derivative comprises an amine derivative, a sulfhydryl derivative, and a carboxylic acid derivative.

According to the method of manufacturing the quantum-dot thin film provided by the present disclosure, the long-chain ligand comprises a homologue, the homologue and the short-chain ligand have a same type of a functional group, and a number of the long-chain ligand and a number of the short-chain ligand are same.

According to the method of manufacturing the quantum-dot thin film provided by the present disclosure, a concentration of the quantum dots in the quantum-dot solution ranges from 0.1 mg/ml to 500 mg/ml.

The present disclosure provides a quantum-dot substrate, comprising an electrode substrate and a quantum-dot thin film disposed on the electrode substrate, wherein the quantum-dot thin film is manufactured by the above method; and
wherein a quantum-dot solution comprises a quantum-dot mixture and a solvent, the quantum-dot mixture comprises a plurality of quantum dots and a plurality of quantum-dot ligands, and the quantum-dot ligands comprise a long-chain ligand and a short-chain ligand.

The present disclosure provides a display panel, comprising the above quantum-dot substrate, wherein the display panel is one of a liquid crystal display panel or an organic light-emitting diode display panel.

Regarding the beneficial effects: the present disclosure provides a method of manufacturing a quantum-dot thin film, a quantum-dot substrate, and a display panel. A plurality of quantum-dot ligands having different lengths of molecular chains are used to modify quantum dots. When the quantum-dot ligand has both long-chain molecules and short-chain molecules, cohesion between particles can be reduced. Thus, the quantum-dot thin film manufactured by an electrophoresis deposition method can have great shape uniformity and good surface uniformity. As such, a shape of the quantum-dot thin film can be improved without changing entire electrical performance, and light efficiency of the quantum-dot thin films can be improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

FIG. 1 is a schematic flowchart showing a method of manufacturing a quantum-dot thin film provided by an embodiment of the present disclosure.

FIG. 2 is a comparison chart showing a surface of the quantum-dot thin film provided by the embodiment of the present disclosure and a surface of a quantum-dot thin film of conventional technologies.

FIG. 4A is a schematic view showing a surface of a quantum-dot thin film manufactured by conventional technologies.

FIG. 4B is a schematic view showing a surface of the quantum-dot thin film provided by the embodiment of the present disclosure.

Figure 3A:
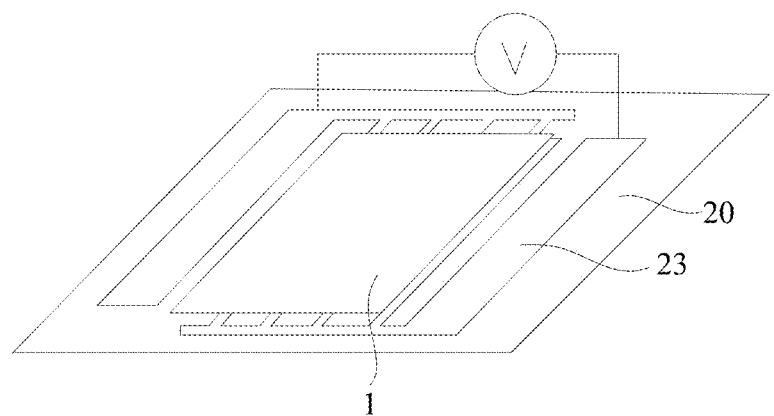
FIG. 3A is a structural schematic plan view showing an electrode substrate provided by the embodiment of the present disclosure.

DESCRIPTION OF REFERENCE NUMBERS quantum-dot thin film 1; quantum-dot mixture 10; quantum dot 101; quantum-dot ligand 102; long-chain ligand 1021; short-chain ligand 1022; solvent 11; electrode substrate 2; substrate 20; first substrate 21; second substrate 22; patterned electrode 23; first patterned electrode 24; second patterned electrode 25; barrier 3.

DETAILED DESCRIPTION

Technical solutions will be described with reference to the accompanying drawings to clearly and fully describe objectives, features, and advantages of embodiments of the present disclosure. However, the embodiments of the present disclosure are only some of the embodiments of the present disclosure, but not all of the embodiments. All other embodiments obtained by those skilled in the art based on the embodiments of the present disclosure without creative efforts are within the scope of the present disclosure. It should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

Colloidal quantum dots (CODs) are semiconductor nanomaterials which have characteristics such as a controllable range of a band gap, a relatively long lifespan of charge carriers, and a capability to be processed in liquid. Pros of the colloidal quantum dots are described as follows: by adjusting a size of the CODs, a wavelength range of emitted light can cover an infrared light spectrum and a visible light spectrum. Furthermore, the CODs have a narrow wave band of emitted light, high color saturation, a high quantum conversion ratio, stable performance, diverse manufacturing ways, and a capability to be manufactured in a solution. In addition, the CODs are easy to be obtained. Therefore, quantum-dot mixtures can be widely used in many fields such as military and national economy. However, in processes of manufacturing quantum-dot thin films by an electrophoresis deposition method, it is difficult to allow the quantum-dot thin films to have both great shape uniformity and good surface uniformity because a molecular chain of quantum dots is relatively long or relatively short.

The present disclosure provides a method of manufacturing a quantum-dot thin film, a quantum-dot substrate, and a display panel. A plurality of quantum-dot ligands having different molecular chain lengths are used to modify a plurality of quantum dots. When the quantum-dot ligands have both long-chain molecules and short-chain molecules, cohesion between particles can be reduced. Thus, quantum-dot thin films manufactured by an electrophoresis deposition method can have great shape uniformity and good surface uniformity. As such, a shape of the quantum-dot thin films can be improved without changing entire electrical performance, and light efficiency of the quantum-dot thin films can be improved.

The following is a detailed description in conjunction with the drawings.

Please refer to FIG. 1, an embodiment of the present disclosure provides a method of manufacturing a quantum-dot thin film, including following steps:

S1, providing a quantum-dot solution, wherein the quantum-dot solution comprises a quantum-dot mixture 10 and a solvent 11, the quantum-dot mixture 10 comprises a plurality of quantum dots 101 and a plurality of quantum-dot ligands 102, and the quantum-dot ligands 102 include a long-chain ligand 1021 and a short-chain ligand 1022;

S2, providing an electrode substrate 2, and dripping the quantum-dot solution onto the electrode substrate 2; and S3, depositing the quantum-dot mixture 10 of the quantum-dot solution on the electrode substrate 2 by an electrophoresis deposition method to form the quantum-dot thin film 1 on the electrode substrate 2.

In the step S1, the quantum dots of the quantum-dot solution include electrical properties. Generally, the quantum dots 101 include a core hell/heterojunction structure and a core. The quantum dots are made of nanoparticles. The quantum-dot ligands 102 need to be added on an outer layer of the quantum dots to improve stability and solubility, thereby preventing an accumulation of the quantum dots 101. Therefore, the quantum dots 101 can be evenly distributed in the solvent 11, and a size of the quantum dots 101 can be controlled to be nanoscale. In conventional technologies, a quantum-dot ligand 102 only includes one of a long-chain ligand 1021 or a short-chain ligand 1022. Different from the conventional technologies, the quantum-dot ligands 102 of the present disclosure include both the long-chain ligand 1021 and the short-chain ligand 1022.

It should be noted that the long-chain ligand 1021 and the short-chain ligand 1022 are relative. For example, in the present embodiment, a material of the long-chain ligand 1021 includes a polymer having a main carbon chain with a number of carbon atoms greater than or equal to 8, and a material of the short-chain ligand 1022 includes a polymer having a main carbon chain with a number of carbon atoms less than 8.

A surface shape of the quantum-dot thin film 1 is greatly affected by a ratio of the short-chain ligands 1022 in the quantum-dot solution. If the ratio of the short-chain ligands 1022 is low, cohesion between particles cannot be well reduced. Consequently, the quantum dots 101 are easy to be accumulated, resulting in poor surface uniformity of the quantum-dot thin film 1. If the ratio of the short-chain ligand 1022 is high, cohesion between particles will be significantly reduced. Consequently, the quantum dots 101 are difficult to be accumulated on the electrode substrate 2, resulting in poor shape uniformity of the quantum-dot thin film 1.

To solve the above issue, a ratio of the long-chain ligand 1021 and a ratio of the short-chain ligand 1022 need to be controlled within an appropriate range. Specifically, in the present disclosure, a ratio of an amount of the short-chain ligand 1022 to an amount of the quantum-dot ligands 102 is controlled to be within a range of 30% to 60%. Therefore, surface uniformity of the quantum-dot thin film 1 can be improved without reducing shape uniformity of the quantum-dot thin film 1.

Optionally, in the present embodiment, the ratio of the amount of the short-chain ligand 1022 to the amount of the quantum-dot ligands 102 may be 30%, 35%, 40%, 45%, 50%, 55%, or 60%. Within the above ratios, surface uniformity of the quantum-dot thin film 1 can be improved. Therefore, the quantum-dot thin film 1 having a great surface shape can be formed. It should be noted that ratio of the amount of the short-chain ligand 1022 to the amount of the quantum-dot ligands 102 can be appropriately adjusted according to an actual situation and specific requirements, and is not limited here.

Please refer to FIG. 2, a comparison chart showing a surface of the quantum-dot thin film provided by the embodiment of the present disclosure and a surface of a quantum-dot thin film of conventional technologies is provided. In FIG. 2, the quantum-dot ligands 102 as shown in the left figure only include the long-chain ligand 1021, and the formed quantum-dot thin film 1 has great shape uniformity but poor surface uniformity. Correspondingly, the quantum dots 102 as shown in the right figure include the long-chain ligand 1021 and the short-chain ligand 1022, and the formed quantum-dot thin film 1 has great shape uniformity and improved shape uniformity compared with quantum-dot thin film 1 as shown in the left figure. Therefore, the quantum-dot thin film 1 manufactured by the method provided by the embodiment of the present disclosure has both great shape uniformity and great surface uniformity. As such, an appearance of the quantum-dot thin film 1 can be improved without changing entire electrical performance, which is beneficial for improving light efficiency of the quantum-dot thin film 1.

An amount of the quantum dots in the quantum-dot solution ranges from 0.1 wt % to 50 wt %. An amount of the quantum-dot ligands 102 in the quantum-dot solution ranges from 0.01 wt % to 50 wt %. That is, a ratio of a mass of the quantum-dot ligands 102 to a total mass of the quantum-dot mixture 10 ranges from 0.01% to 50%. This arrangement can not only prevent an excess of quantum-dot ligands 102 but also ensure that appropriate cohesion between quantum dots in the quantum-dot solution. As such, the quantum dots can be evenly distributed in the quantum-dot solution.

Optionally, the amount of the quantum-dot ligands 102 may be 0.01 wt %, 0.1 wt %, 1 wt %, 5 wt %, 10 wt %, 15 wt %, 20 wt %, 25 wt %, 30 wt %, 35 wt %, 40 wt %, 45 wt %, or 50 wt %. It should be understood that the amount of the quantum-dot ligands 102 can be appropriately adjusted according to an actual situation and specific requirements, and is not limited here.

The quantum-dot solution further includes the solvent 11 having an amount of 1 wt % to 90 wt %. The quantum dots 101 and the solvent 11 need to be adapted to each other. That is, the quantum dots need to be stably disposed in the solvent 11.

Optionally, an amount of the solvent 11 may be 1 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, or 90 wt %. It should be understood that the amount of the solvent 11 can be appropriately adjusted according to an actual situation and specific requirements, and is not limited here.

In the embodiment of the present disclosure, the quantum-dot ligands 102 include a polyalcohol derivative and a polyester derivative having different molecular weights, and a molecular weight of the polyalcohol derivative and a molecular weight of the polyester derivative range from 50 to 5000.

In the embodiment of the present disclosure, a molecular weight of the long-chain ligand 1021 ranges from 800 to 5000, and a molecular weight of the short-chain ligand 1022 ranges from 50 to 700.

Optionally, the molecular weight of the long-chain ligand 1021 may be 800, 1000, 1500, 2000, 2500, 3000, 3500, 4000, 4500, or 5000. Preferably, the molecular weight of the long-chain ligand 1021 is 1000. The molecular weight of the short-chain ligand 1022 may be 50, 100, 150, 200, 250, 300, 350, 400, 450, 500, 550, 600, 650, 700, 750, or 800. Preferably, the molecular weight of the short-chain ligand 1022 is 400.

Specifically, in the embodiment of the present disclosure, the polyalcohol derivative comprises a polyethylene glycol derivative, a poly(ethylene adipate) derivative, and a thiol derivative, and the polyester derivative comprises an amine derivative, a sulfhydryl derivative, and a carboxylic acid derivative.

In the embodiment of the present disclosure, the long-chain ligand 1021 includes a homologue, the homologue and the short-chain ligand 1022 have a same type of a functional group, and a number of the long-chain ligand 1021 and a number of the short-chain 1022 ligand are same.

For example, the long-chain ligand 1021 is a long-chain poly(ethylene adipate) (PEA) derivative with an amino group, and the short-chain ligand 1022 is a short-chain PEA derivative with an amino group. Alternatively, the long-chain ligand 1021 is a long-chain PEA derivative with a sulfhydryl group, and the short-chain ligand 1022 is a short-chain PEA derivative with a sulfhydryl group. Alternatively, the long-chain ligand 1021 is a long-chain polyethylene glycol (PEG) derivative with a sulfhydryl group, and the short-chain ligand 1022 is a short-chain PEG derivative with a sulfhydryl group.

Specifically, in the embodiment of the present disclosure, a chemical formula of the long-chain ligand 1021 is:

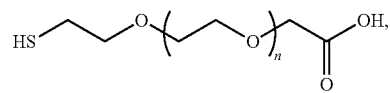

and a chemical formula of the short-chain lignad 1022 includes one of

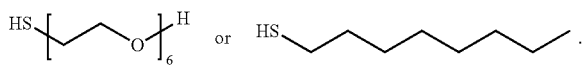

Electrophoresis deposition efficiency of the quantum dots 101 is greatly affected by a concentration of the quantum dots 101 in the quantum-dot solution. If the concentration of the quantum dots 101 in the quantum-dot solution is high, an electrophoresis deposition rate of the quantum dots 101 will be too fast. Therefore, it is difficult to control a thickness of the quantum-dot thin film 1. If the concentration of the quantum dots 101 in the quantum-dot solution is low, an electrophoresis deposition rate of the quantum dots 101 will be too slow. As such, electrophoresis depostiion efficiency of the quantum dot will be reduced without a doubt. To solve the above issue, the concentration of the quantum dots 101 in the quantum dot solution is controlled to be within a range of 0.1 mg/ml to 500 mg/ml. Because of the above arrangement, a thickness of the quantum-dot thin film 1 is easy to be controlled, and an electrophoresis deposition rate of the quantum dots 101 can be ensured. As such, electrophoresis deposition efficiency of the quantum dots is improved, thereby forming the quantum-dot thin film 1 having a great appaerance.

Optionally, in the embodiment of the present disclosure, the concentration of the quantum dots 101 in the quantum-dot solution may be 0.1 mg/ml, 0.5 mg/ml, 1 mg/ml, 50 mg/ml, 100 mg/ml, 150 mg/ml, 200 mg/ml, 250 mg/ml, 300 mg/ml, 350 mg/ml, 400 mg/ml, 450 mg/ml, or 500 mg/ml. The above concentrations can well prompt the quantum dots 101 to be deposited by electrophoresis, thereby forming the quantum-dot thin film 1 with a great appearance. It should be understood that the concentration of the quantum dots in the quantum-dot solution can be appropriately adjusted according to an actual situation and specific requirements, and is not limited here.

Specifically, the quantum dots 101 are constituted by an element in group IV, groups II-VI, groups IV-VI, or groups III-V. Specifically, the quantum dots 101 are mainly constituted by an element in group IVA, groups IIB-VIA, groups IIIA-VA, or groups IVA-VIA. For example, when the quantum dots 101 are constituted by an element in group IVA, the quantum dots may include a carbon quantum dot, a silicon quantum dot, or a germanium quantum dot. When the quantum dots 101 are constituted by an element in groups IIB-VIA, the quantum dots may include a zinc sulfide quantum dot or a cadmium sulfide quantum dot. When the quantum dots 101 are constituted by an element in groups IIIA-VA, the quantum dots may include an indium phosphide quantum dot, a gallium arsenide quantum dot, or an indium arsenide quantum dot. When the quantum dots 101 are constituted by an element in groups IVA-VIA, the quantum dots 101 may include a lead sulfide quantum dot, a lead selenide quantum dot, or a lead telluride quantum dot. Of course, the quantum dots 101 may also include a composition quantum dot having high stability, such as a hydrogel loading a quantum dot or a cadmium selenide-silica quantum dot, or a perovskite quantum dot. It should be understood that a specific material of the quantum dots 101 may be appropriately adjusted according to an actual situation and specific requirements.

In some embodiments of the present disclosure, the solvent 11 may be water, an alcohol compound, an ether, an ester, or an alkane. The solvent 11 may be ethanol, ether, ethyl acetate, or n-octane. Of course, the colloidal solvent 11 can be appropriately adjusted according to an actual situation and specific requirements. For example, the colloidal solvent 11 may also be water, 2-acetoxy-1-methoxypropane (PEMEA), or other compounds, and is not limited here.

In one embodiment, the quantum-dot thin film 1 may be manufactured by using a vertical eletric field panel method or a horizontal electric field dripping method to realize electrophoresis deposition. Specifically, take the horizontal electric field dripping method as an example. As shown in FIG. 3, a structural schematic perspective view showing the electrode substrate provided by the embodiment of the present disclosure is provided. The electrode substrate 2 includes a substrate 20. A patterned electrode 23 is disposed on the substrate 20. Two voltage ends are connected to the patterned electrode 23, and two opposite voltages are respectively applied to the two voltage ends, thereby forming a pathway between the two voltage ends and the patterned electrode 23. Thus, the quantum-dot thin film 1 can be formed on the electrode substrate 2. The patterned electrode 23 is a patterned electrode. Because a shape of the manufactured quantum-dot thin film 1 and a shape of the patterned electrode 23 are basically same, an electrode can be patterned to be a corresponding shape according to a required shape of the quantum-dot thin film 1. As such, the patterned electrode 23 can be manufactured.

A material of the substrate 20 may be glass. Of course, the material of the substrate 20 can be adjusted. For example, the material of the substrate 20 may be polyimide (PI), polyethylene glycol terephthalate (PET), polycarbonate (PC), polyarylate (PAR), polyethersulfone (PES), polyethylene naphthalate two formic acid glycolester (PEN), or fiber reinforced plastic, and is not limited here.

A material of the patterned electrode 23 may be conductive material. Specifically, the material of the patterned electrode 23 may be metal or a metal oxide. For example, the material of the patterned electrode 23 may be at least one of Cu, Ag, indium tin oxide (ITO), Mo, or Al. Of course, the material of the patterned electrode 23 may be appropriately adjusted according to an actual situation or specific requirements, and is not limited here.

Figure 3B:
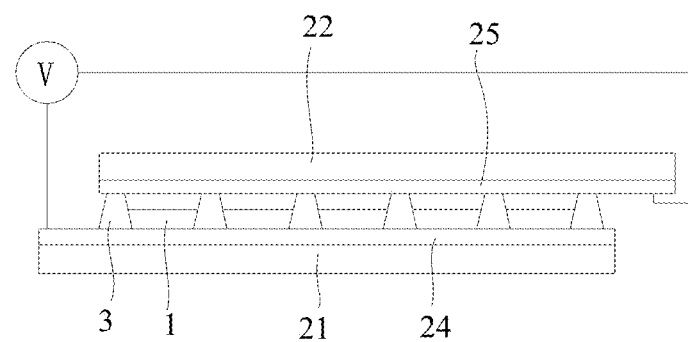
FIG. 3B is a structural schematic perspective view showing the electrode substrate provided by the embodiment of the present disclosure.

Take the vertical electric field panel method as an example. As shown in FIG. 3B, a structural schematic perspective view showing the electrode substrate provided by the embodiment of the present disclosure is provided. The electrode substrate 2 includes a first substrate 21 and a second substrate 22 opposite to each other. A first patterned electrode 24 is disposed on the first substrate 21. A second patterned electrode 25 is disposed on the second substrate 22. A plurality of barriers 3 are disposed between the first patterned electrode 24 and the second patterned electrode 25. The quantum-dot solution is poured between two adjacent barriers 3, and two voltages having opposite polarities are respectively applied to the first patterned electrode 24 and the second patterned electrode 25. Therefore, an electric field is formed between the first patterned electrode 24 and the second patterned electrode 25, which makes the quantum dots be deposited on the first substrate 21 and the second substrate 22. Therefore, the quantum-dot thin film 1 can be formed on the first substrate 21 and the second substrate 22. The first substrate 21 may be an array substrate. The second substrate 22 may be a color filter substrate. An intensity and a direction of the electric field can be correspondingly adjusted according to an actual situation and specific requirements.

Of course, the quantum-dot thin film 1 can also be manufactured by using an immersion method to realize electrophoresis deposition. Specifically, the electrode substrate 2 is immersed in the quantum-dot solution. The quantum dots in the quantum-dot solution is deposited on the electrode substrate 2 by electrophoresis deposition, thereby forming the quantum-dot thin film 1 on the electrode substrate 2.

In the step S3, an intensity of the electric field ranges from $5*10^5$ V/m to $4*10^7$ V/m. An electrophoresis deposition rate can be adjusted by adjusting the intensity of the electric field, and a thickness of the quantum-dot thin film 1 can be further adjusted. For example, the intensity of the electric field during electrophoresis deposition may be $5*10^5$ V/m, $1*10^6$ V/m, $5*10^6$ V/m, $1*10^7$ V/m, $2*10^7$ V/m, $3*10^7$ V/m, or $4*10^7$ V/m. The intensity of the electric field during electrophoresis deposition can be appropriately adjusted according to an actual situation and specific requirements, and is not limited here.

In the step S3, a voltage-applied period of electrophoresis deposition ranges from 1 s to 3600 s. For example, the period of electrophoresis deposition may be 1 s, 100 s, 1000 s, 1800 s, 2500 s, 3000 s, or 3600 s. The period of electrophoresis deposition can be appropriately adjusted according to an actual situation and specific requirements, and is not limited here.

It should be noted that the quantum-dot thin film 1 manufactured by the embodiment of the present disclosure can be applied to manufacture color filters and organic light-emitting diode (OLED) display devices. Therefore, the quantum-dot thin film 1 is not necessary to be stripped off from the electrode substrate 2 after being manufactured. For example, when the quantum-dot thin film 1 is applied to manufacture the color filter substrates, the electrode substrate 2 and the quantum-dot thin film 1 disposed on the electrode substrate 2 can be used as the color filter substrates, and the quantum-dot thin film 1 is a color filter layer. When the quantum-dot thin film 1 is applied to manufacture the OLED display devices, the patterned electrode 23 of the electrode substrate 2 can be used as an anode or a cathode of an OLED, and the quantum-dot thin film 1 can be used as a hole injection layer, an electron injection layer, a hole transport layer, an electron injection layer, or a luminescent layer.

The inventor did experiments on the quantum-dot thin film 1 applied to color filters. Please refer to FIG. 4A and FIG. 4B. In FIG. 4A, when a red quantum-dot layer of the quantum-dot thin film 1 is manufactured, the red quantum-dot layer has a poor surface appearance because the quantum-dot ligands 102 only include the long-chain ligand 1021. In FIG. 4B, when a red quantum-dot layer of the quantum-dot thin film 1 is manufactured, the red quantum-dot layer has a significantly improved surface appearance because the quantum-dot ligands 102 include both the long-chain ligand 1021 and short-chain ligand 1022 and an amount of the long-chain ligand 1021 and an amount of the short-chain ligand 1022 are within an appropriate range.

An embodiment of the present disclosure further provides a quantum-dot substrate, including the electrode substrate 2 and the quantum-dot thin film 1 disposed on the electrode substrate 2. The quantum-dot thin film 1 is manufactured by the above method of manufacturing the quantum-dot thin film. Since the quantum-dot substrate uses all technical solutions described by the above embodiments, the quantum-dot substrate includes all beneficial effects of the technical solutions described in the above embodiments, which are not described here in detail again.

An embodiment of the present disclosure further provides a display panel, including the quantum-dot substrate of the above embodiment. The display panel may be one of a liquid crystal display panel or an organic light-emitting diode display panel.

Regarding the beneficial effects: the present disclosure provides a method of manufacturing a quantum-dot thin film, a quantum-dot substrate, and a display panel. A plurality of quantum-dot ligands having different molecular chain lengths are used to modify a plurality of quantum dots. When the quantum-dot ligands have both long-chain molecules and short-chain molecules, cohesion between particles can be reduced. Thus, the quantum-dot thin film manufactured by an electrophoresis deposition method can have great shape uniformity and good surface uniformity. As such, a shape of the quantum-dot thin film can be improved without changing entire electrical performance, and light efficiency of the quantum-dot thin films can be improved.

It should be noted that described embodiments are merely used to construct the present disclosure and are not intended to limit the present disclosure.

What is claimed is:

1. A method of manufacturing a quantum-dot thin film, comprising following steps:
   providing a quantum-dot solution, wherein the quantum-dot solution comprises a quantum-dot mixture and a solvent, the quantum-dot mixture comprises a plurality of quantum dots and a plurality of quantum-dot ligands, and the quantum-dot ligands comprise a long-chain ligand and a short-chain ligand;
   providing an electrode substrate, and dripping the quantum-dot solution onto the electrode substrate; and
   depositing the quantum-dot mixture of the quantum-dot solution on the electrode substrate by an electrophoresis deposition method to form the quantum-dot thin film on the electrode substrate,
   wherein the long-chain ligand is selected from a polymer having a main carbon chain with a number of carbon atoms greater than or equal to 8 and the short-chain ligand is selected from a polymer having a main carbon chain with a number of carbon atoms less than 8.

2. The method of claim 1, wherein a ratio of an amount of the short-chain ligand to a total amount of the quantum-dot ligands ranges from 30% to 60%.

3. The method of claim 1, wherein an amount of the quantum dots in the quantum-dot solution ranges from 0.1 wt % to 50 wt %, an amount of the quantum-dot ligands in the quantum-dot solution ranges from 0.01 wt % to 50 wt %, and the quantum-dot solution comprises the 1 wt % to 90 wt % solvent.

4. The method of claim 1, wherein the quantum-dot ligands comprise a polyalcohol derivative and a polyester derivative having different molecular weights, and a molecular weight of the polyalcohol derivative and a molecular weight of the polyester derivative range from 50 to 5000.

5. The method of claim 4, wherein a molecular weight of the long-chain ligand ranges from 800 to 5000, and a molecular weight of the short-chain ligand ranges from 50 to 700.

6. The method of claim 4, wherein the polyalcohol derivative comprises a polyethylene glycol derivative, a poly(ethylene adipate) derivative, and a thiol derivative, and the polyester derivative comprises an amine derivative, a sulfhydryl derivative, and a carboxylic acid derivative.

7. The method of claim 1, wherein the long-chain ligand comprises a homologue, the homologue and the short-chain ligand have a same type of a functional group, and a number of molecules of the long-chain ligand and a number of molecules of the short-chain ligand are same.

8. The method of claim 1, wherein a concentration of the quantum dots in the quantum-dot solution ranges from 0.1 mg/ml to 500 mg/ml.

\* \* \* \* \*